US007755083B2

United States Patent
Lin

(10) Patent No.: US 7,755,083 B2
(45) Date of Patent: Jul. 13, 2010

(54) PACKAGE MODULE WITH ALIGNMENT STRUCTURE AND ELECTRONIC DEVICE WITH THE SAME

(75) Inventor: Chih-Hsiung Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 884 days.

(21) Appl. No.: 11/365,181

(22) Filed: Mar. 1, 2006

(65) Prior Publication Data
US 2007/0132071 A1 Jun. 14, 2007

(30) Foreign Application Priority Data
Dec. 9, 2005 (TW) .............................. 94143575 A

(51) Int. Cl.
*H01L 23/58* (2006.01)
(52) U.S. Cl. .................. 257/48; 257/737; 257/773; 257/778; 257/780; 257/784; 257/E23.197
(58) Field of Classification Search ............... 257/777, 257/778, 48, 666–733, 797, 734–786, E23.01–E23.079, 257/E23.141–E23.179
See application file for complete search history.

(56) References Cited
U.S. PATENT DOCUMENTS
5,767,528 A * 6/1998 Sumi et al. ................. 257/48

6,781,218 B1 * 8/2004 Wilsher ..................... 257/662
6,836,138 B1 * 12/2004 Park et al. .................. 324/765
7,180,165 B2 * 2/2007 Ellsberry et al. ........... 257/777
7,294,928 B2 * 11/2007 Bang et al. ................ 257/737

FOREIGN PATENT DOCUMENTS
CN 1601717 3/2005
JP 09051015 2/1997

OTHER PUBLICATIONS
CN Office Action mailed May 25, 2007.

* cited by examiner

Primary Examiner—Jasmine J Clark
(74) Attorney, Agent, or Firm—Thomas, Kayden, Horstemeyer & Risley

(57) ABSTRACT

A package module with an alignment structure is provided by this invention. The package module comprises a package substrate having a die region and a die disposed thereon. At least one pair of conductive alignment protrusions is disposed in the die region and is separated from each other by the die. A test pad is disposed on the package substrate opposing the die and electrically connected to the pair of conductive alignment protrusions. An electronic device with an alignment structure and an inspection method after mounting is also disclosed.

11 Claims, 4 Drawing Sheets

PACKAGE MODULE WITH ALIGNMENT STRUCTURE AND ELECTRONIC DEVICE WITH THE SAME

BACKGROUND OF THE INVENTION

1. Field of the Invention

The present invention relates to an electronic package, and in particular to a package module with an alignment structure and an electronic device with the same.

2. Description of the Related Art

Demand for small, high performance portable electronic products such as cell phones, mobile computers, and the like have driven the industry to increase integration on individual semiconductor dice. Accordingly, the industry is achieving high integration by turning to 3D packaging by combining assembly technologies including wire bonding or flip chip to stack die packages to form a multi-package module (MPM).

MPM, a current assembly technology, integrates different dice functions, such as microprocessors or memory, logic, optic ICs, instead of placing individual packages onto a large printed circuit board (PCB). MPM, however, has a much higher power density than an individual single die package. Thus, thermal management is a key factor in its successful development.

FIG. 1 illustrates a conventional electronic device 100 with an MPM. The electronic device 100 comprises an MPM 20 mounted on a PCB 101 and comprising a package substrate 12. The upper and lower surfaces of the package substrate 12 have dice 16 and 14 with different functions thereon, respectively, to create the MPM 20. For example, the die 16 is mounted on the upper surface of the package substrate 12 by bumps (or solder balls) of a package substrate 12'. The die 14 is mounted on the lower surface of the package substrate 12 by flip chip. The lower surface of the package substrate 12 comprises a plurality of bumps 10 thereon to correspondingly connect to the bonding pads (not shown) on the PCB 101. In the MPM 20, heat generated from the die 16 can be dissipated by radiation and convection. The gap between the die 14 and the PCB 101 is too narrow, however, to dissipate the heat generated therefrom by radiation and convection. Accordingly, heat generated from the die 14 is dissipated by conduction only. Typically, a metal layer 102 is disposed on the PCB 101 corresponding to the die 14 and connected to the die 14 by a heat conductive paste 22. That is, thermal dissipation is accomplished by a thermal conductive path created by the heat conductive paste 22, the metal layer 102 and the PCB 101.

During mounting of MPM 20 on the PCB 101, however, misalignment or slanting may be occur therebetween, such that the die 14 does not completely contact the heat conductive paste 22, reducing heat dissipation efficiency, as shown in FIG. 1. Moreover, the die 14 may operate unstably at high temperature due to poor heat dissipation.

BRIEF SUMMARY OF THE INVENTION

A detailed description is given in the following embodiments with reference to the accompanying drawings. A package module with an alignment structure, an electronic device with the same and an inspection method after mounting are provided. An embodiment of a package module with an alignment structure comprises a package substrate having a die region and a die disposed thereon. At least one pair of conductive alignment protrusions is disposed in the die region and is separated from each other by the die. A test pad is disposed on the package substrate opposing the die and electrically connected to the pair of conductive alignment protrusions.

An embodiment of an electronic device with an alignment structure comprises a package module and a circuit board. The package module comprises a package substrate having a die region and a die disposed thereon. At least one pair of conductive alignment protrusions is disposed in the die region and is separated from each other by the die. A first test pad is disposed on the package substrate opposing the die and electrically connected to the pair of conductive alignment protrusions. An array bumps is arranged on the package substrate except in the die region. The circuit board comprises a plurality of first bonding pads correspondingly connecting the array of bumps. At least one pair of second bonding pads correspondingly connects the pair of conductive alignment protrusions. A second test pad is electrically connected to the pair of second bonding pads.

An embodiment of an inspection method after mounting comprises providing a package module with an alignment structure, comprising a package substrate having a die region and a die disposed thereon. At least one pair of conductive alignment protrusions is disposed in the die region and is separated from each other by the die. A first test pad is disposed on the package substrate opposing the die and electrically connected to the pair of conductive alignment protrusions. A circuit board is provided, comprising at least one pair of second bonding pads correspondingly connecting the pair of conductive alignment protrusions. A second test pad is electrically connected to the pair of second bonding pads. The package module is mounted on the circuit board. Open/short tests are performed between the first and second test pads to determine whether or not the pair of conductive alignment protrusions is aligned to and contacts the pair of second bonding pads.

BRIEF DESCRIPTION OF DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
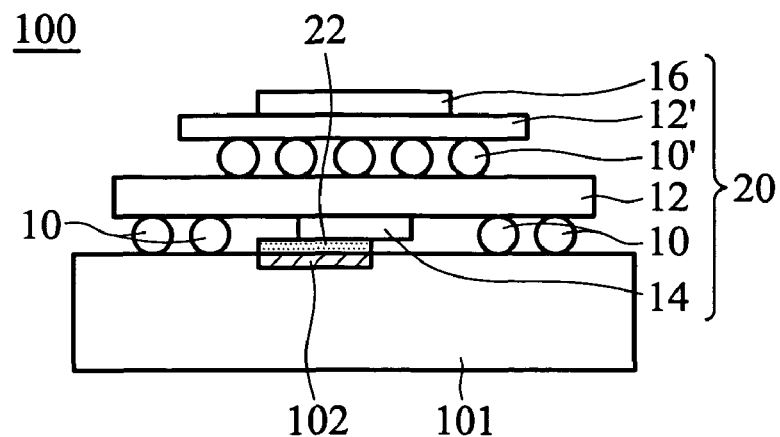
FIG. 1 shows a cross-section of a conventional electronic device with a multi-package module.
Figure 2:
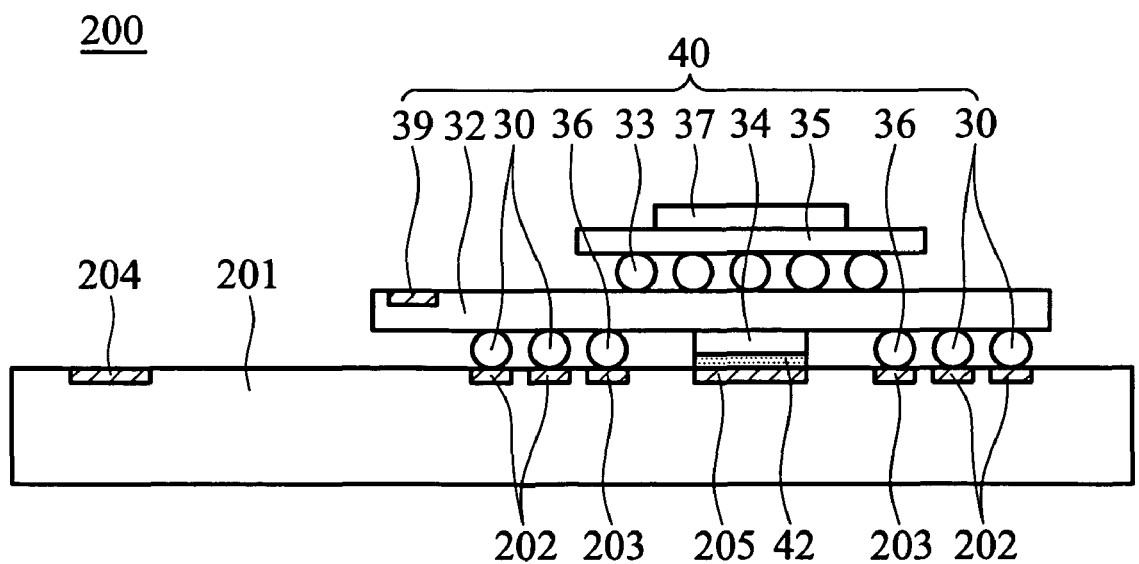
FIG. 2 shows a cross-section of an embodiment of an electronic device with an alignment structure.

FIG. 2 illustrates an embodiment of an electronic device 200 with an alignment structure. The device 200 comprises a multi-package module (MPM) 40 mounted on a circuit board 201, such as a printed circuit board (PCB).

The MPM 40 comprises a package substrate 32, at least one pair of conductive alignment protrusions 36, a first test pad 39 and an array of bumps 30. The lower surface of the package substrate 32 has a die region (not shown) and the upper surface of the package substrate 32 also has a die region (not shown). Here, the lower surface represents a surface facing the surface of a circuit board 201, such as a printed circuit board (PCB), and the upper surface represents the surface opposite to the lower surface. In this embodiment, the package substrate 32 may comprise plastic, ceramic, inorganic or organic material. Typically, the die region is substantially at the center of the package substrate 32.

Dice 34 and 37 with different functions may be respectively mounted in the die region of the lower surface and that of the upper surface of the package substrate 32 by the same or different electronic packages. For example, the dice 34 and 37 may be mounted onto the package substrates 32 and 35, respectively, by flip chip or wire bonding, the package substrate 35 is then mounted in the die region of the upper surface of the package substrate 32 by bumps or solder balls (indicated by label 33) formed on the package substrate 35.

At least one pair of conductive alignment protrusions 36, such as metal bumps or solder balls, are disposed in the die region of the lower substrate of the package substrate 32 and separated from each other by the die 34. In this embodiment, the pair of conductive alignment protrusions 36 is higher than the die 34. The arrangement of the pair of conductive alignment protrusions 36 is described later.

A first test pad 39, such as a metal pad, is disposed on the upper surface of the package substrate 32 outside the die region. The first test pad 39 may be electrically connected to the pair of conductive alignment protrusions 36 by wiring line (not shown).

An array of bumps 30, such as metal bumps, solder balls, signal balls or the like, is arranged on the lower surface of the package substrate 32 except in the die region, to transport signals to external circuits from the dice 34 and 37.

A circuit board 201 comprises a plurality of first bonding pads 202, at least one pair of second bonding pad 203, a second test pad 204 and a metal layer 205. The first bonding pads 202 are correspondingly connected to the array of bumps 30, thereby electrically connecting the circuit board 201 and the dice 34 and 37. Typically, the circuit board 201 comprises at least one or more metal layers and at least one or more insulating layers, in which the metal layer may serve as a signal layer, a power layer, and/or a grounding layer. In order to simplify the diagram, a flat substrate is depicted.

The pair of second bonding pad 203 is correspondingly connected to the pair of conductive alignment protrusions 36. Note that the location and the amount of the pair of second bonding pad 203 depend on that of the pair of conductive alignment protrusions 36 of the MPM 40.

A second test pad 204, such as a metal pad may electrically connect the pair of second bonding pad 203 by wiring line (not shown).

The metal layer 205 corresponds to the die 34 on the low surface of the package substrate 32 and contacts the die by a heat conductive paste 42. The heat conductive paste 42, the metal layer 205 and the circuit board 201 create a heat conductive path for heat dissipation of the die 34.

Figure 3A:
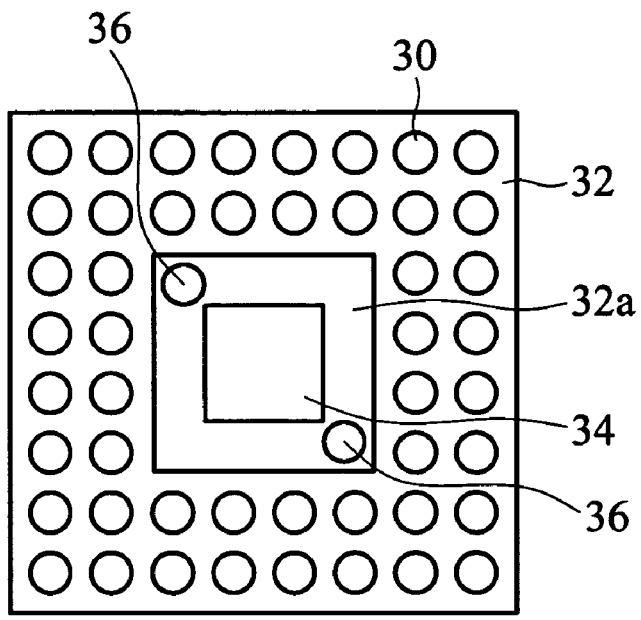
FIGS. 3A to 3C are bottom plan views of various embodiments of a package module with an alignment structure.
Figure 3B:
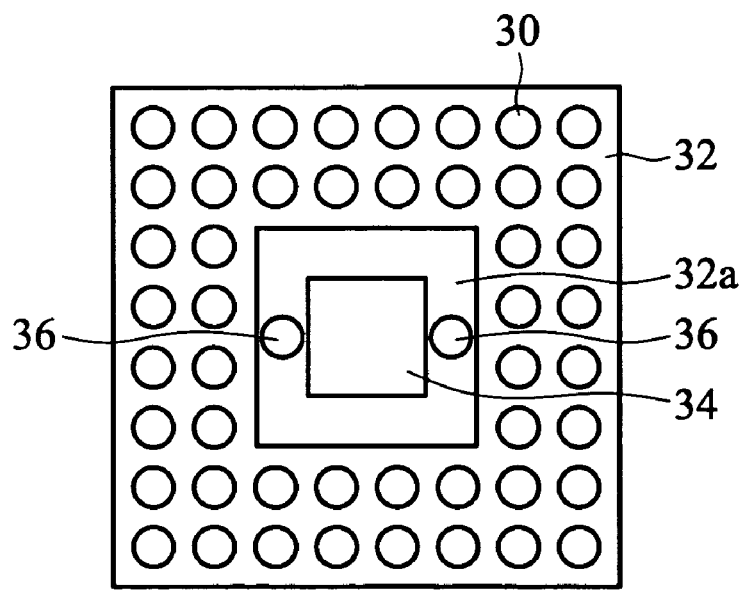
Figure 3C:
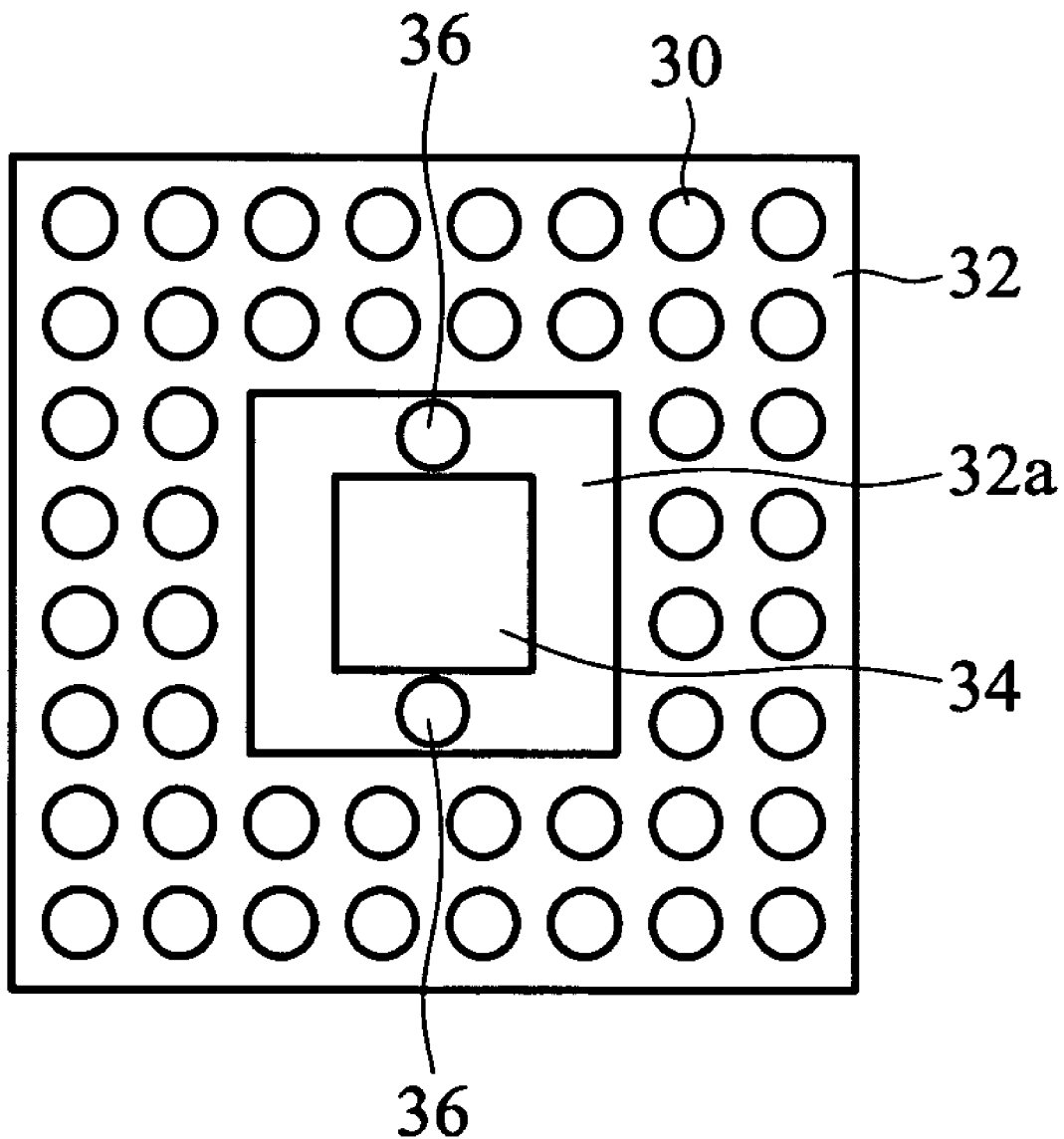

FIGS. 3A to 3C are bottom plan views of various embodiments of a multi-package module (MPM) 40 with an alignment structure, and the same reference numbers as FIG. 2 are used, wherefrom like descriptions are omitted. In FIG. 3A, at least one pair of conductive alignment protrusions 36 is disposed in the die region 32a of the lower surface of the package substrate 32 and respectively adjacent to a pair of opposing corners of the die 34. In some embodiments, the MPM 40 may comprise two pair of conductive alignment protrusions 36 respectively adjacent to four corners of the die 34. In some embodiments, the pair of conductive alignment protrusions 36 may be respectively adjacent to a pair of opposing edges of the die 34, as shown in 3B or 3C. Also, the MPM 40 may comprise two pair of conductive alignment protrusions 36 respectively adjacent to four edges of the die 34.

Figure 4:
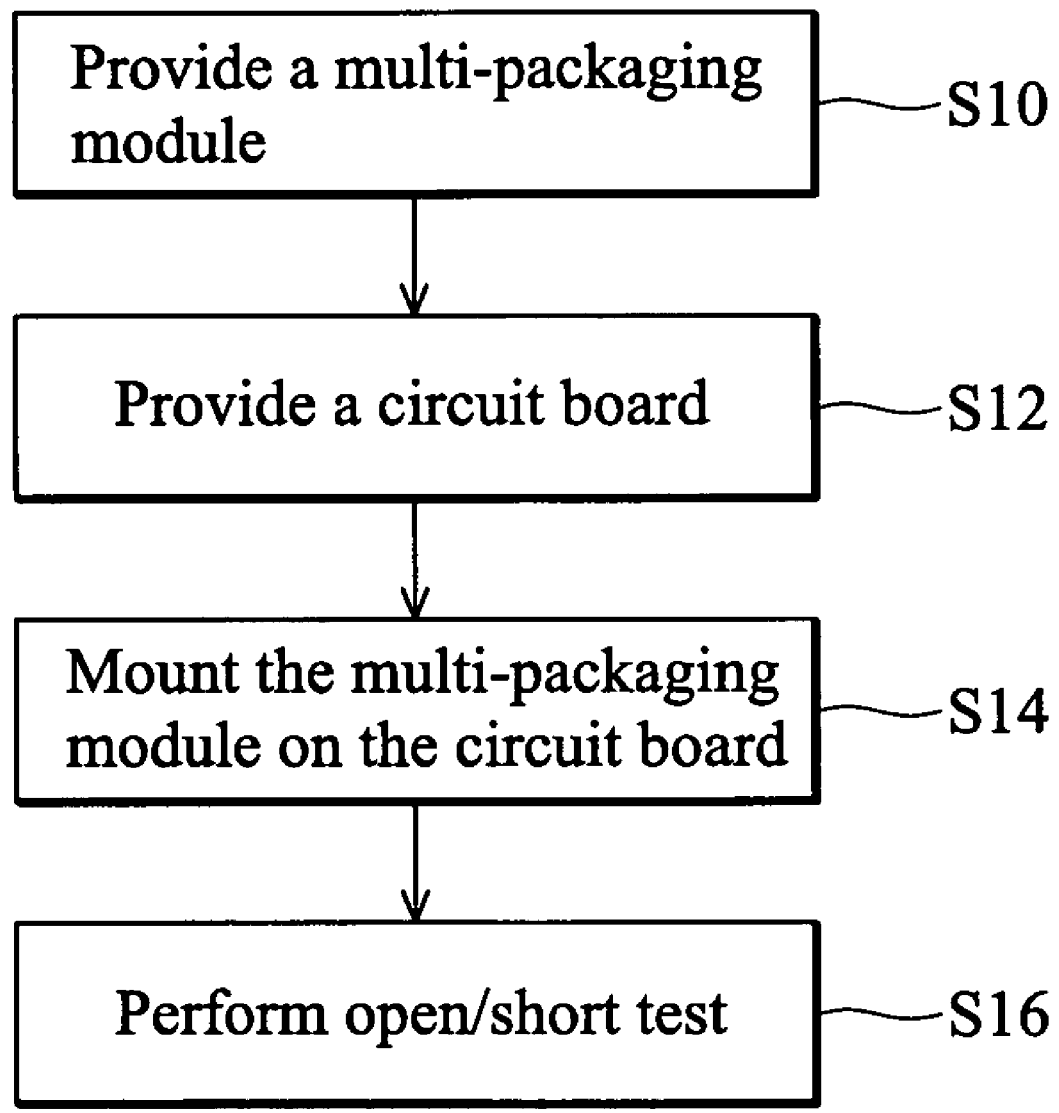
FIG. 4 is a flow chart of an embodiment of an inspection method after mounting.

FIG. 4 is a flow chart of an embodiment of an inspection method after mounting. In step S10, a multi-package module 40 with an alignment structure is provided. As shown in FIGS. 2 and 3A, the MPM 40 may comprise a package substrate 32 having a die region 32a and a die 34 therein. At least one pair of conductive alignment protrusions 36 is disposed in the die region 32a and separated from each other by the die 34. A first test pad 39 is disposed on the package substrate 32, opposing to the die 34 and electrically connected to the pair of conductive alignment protrusions 36.

In step S12, a circuit board 201 is provided. As shown in FIG. 2, the circuit board 201 may comprise at least one pair of second bonding pads 203 corresponding to the pair of conductive alignment protrusions 36. A second test pad 204 is electrically connected to the pair of second bonding pads 203.

In step S14, the MPM 40 is mounted on the circuit board 201. In step S16, an open/short test is performed between the first and second test pads 39 and 204, thereby determining whether or not the pair of conductive alignment protrusions 36 is aligned to and contacts the pair of second bonding pads 203. For example, a multimeter is employed for the open/short tests between the first and second test pads 39 and 204. A short circuit between the first and second test pads 39 and 204 represents that the pair of conductive alignment protrusions 36 is aligned to and contacts the pair of second bonding pads 203. That is, the package module 40 is mounted on the circuit board 201 without misalignment or slanting. As a result, the die 34 can completely contact the heat conductive paste 42, providing better heat dissipation efficiency. Conversely, an open circuit between the first and second test pads 39 and 204 represents the pair of conductive alignment protrusions 36 is not aligned to the pair of second bonding pads 203. That is misalignment or slanting may be occur as the MPM 40 is mounted on the circuit board 201. As a result, the die 34 cannot completely contact the heat conductive paste 42, reducing heat dissipation efficiency.

According to the invention, the MPM comprises conductive alignment protrusions and a test pad electrically connected thereto and the circuit board comprises bonding pads corresponding to the conductive alignment protrusions and a test pad electrically connected thereto. Accordingly, Open/short tests can be performed between the test pads to determine whether or not the die on the package substrate is aligned to and contacts the heat conductive paste, ensuring heat dissipation efficiency of the device and preventing the die from unstable operation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package module with an alignment structure, comprising:
    a package substrate having a lower surface and an upper surface opposite the lower surface; a die region and a die disposed on the lower surface;
    at least one pair of conductive alignment protrusions disposed in the die region and separated from each other by the die;

a test pad disposed on the upper surface, opposing the die on the lower surface and outside a projecting region of the die region, wherein the test pad is electrically connected to the pair of conductive alignment protrusions; and an array of bumps arranged on the lower surface of the package substrate except in the die region and opposing the test pad.

2. The package module as claimed in claim 1, wherein the die is mounted on the package substrate by flip chip or wire bonding.

3. The package module as claimed in claim 1, wherein the pair of conductive alignment protrusions is higher than the die.

4. The package module as claimed in claim 1, wherein the pair of conductive alignment protrusions is respectively adjacent to a pair of opposing edges of the die.

5. The package module as claimed in claim 1, wherein the pair of conductive alignment protrusions is respectively adjacent to a pair of opposing corners of the die.

6. An inspection method after mounting, comprising:
   providing a package module with an alignment structure, comprising:
      a package substrate having a lower surface and an upper surface opposite the lower surface;
      a die region and a die disposed on the lower surface;
      at least one pair of conductive alignment protrusions disposed in the die region and separated from each other by the die; and
      a first test pad disposed on the upper surface, opposing the die on the lower surface and electrically connected to the pair of conductive alignment protrusions;
   providing a circuit board, comprising:
      at least one pair of second bonding pads corresponding to the pair of conductive alignment protrusions; and
      a second test pad electrically connected to the pair of second bonding pads;
   mounting the package module on the circuit board; and
   performing open/short tests between the first and second test pads to determine whether or not the pair of conductive alignment protrusions is aligned to and contacts the pair of second bonding pads.

7. An electronic device with an alignment structure, comprising:
   a package module with an alignment structure, comprising:
      a package substrate having a lower surface and an upper surface opposite the lower surface;
      a die region and a die disposed on the lower surface;
      at least one pair of conductive alignment protrusions disposed in the die region and separated from each other by the die;
      a first test pad disposed on the upper surface, opposing the die on the lower surface and electrically connected to the pair of conductive alignment protrusions; and
      an array of bumps arranged on the lower surface except in the die region; and
   a circuit board, comprising:
      a plurality of first bonding pads correspondingly connecting the array of bumps;
      at least one pair of second bonding pads correspondingly connecting the pair of conductive alignment protrusions; and
      a second test pad electrically connected to the pair of second bonding pads.

8. The electronic device as claimed in claim 7, wherein the die is mounted on the package substrate by flip chip or wire bonding.

9. The electronic device as claimed in claim 7, wherein the pair of conductive alignment protrusions is higher than the die.

10. The electronic device as claimed in claim 7, wherein the pair of conductive alignment protrusions is respectively adjacent to a pair of opposing edges of the die.

11. The electronic device as claimed in claim 7, wherein the pair of conductive alignment protrusions is respectively adjacent to a pair of opposing corners of the die.

* * * * *